(12) United States Patent
Mazzocchi et al.

(10) Patent No.: US 10,453,960 B2
(45) Date of Patent: Oct. 22, 2019

(54) TRANSISTOR HAVING STRUCTURED SOURCE AND DRAIN REGIONS AND PRODUCTION METHOD THEREOF

(71) Applicant: COMMISSARIAT A L'ENERGIE ATOMIQUE ET AUX ENERGIES ALTERNATIVES, Paris (FR)

(72) Inventors: Vincent Mazzocchi, Grenoble (FR); Laurent Grenouillet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/918,023

(22) Filed: Mar. 12, 2018

(65) Prior Publication Data
US 2018/0261697 A1 Sep. 13, 2018

(30) Foreign Application Priority Data
Mar. 13, 2017 (FR) ...................................... 17 52035

(51) Int. Cl.
| | | |
|---|---|---|
| H01L 29/78 | (2006.01) | |
| H01L 27/12 | (2006.01) | |
| H01L 21/02 | (2006.01) | |
| H01L 29/36 | (2006.01) | |
| H01L 29/04 | (2006.01) | |
| H01L 29/08 | (2006.01) | |
| H01L 29/66 | (2006.01) | |
| H01L 29/786 | (2006.01) | |

(52) U.S. Cl.
CPC .... H01L 29/7848 (2013.01); H01L 21/02532 (2013.01); H01L 27/1203 (2013.01); H01L 29/04 (2013.01); H01L 29/0847 (2013.01); H01L 29/36 (2013.01); H01L 29/66628 (2013.01); H01L 29/66772 (2013.01);
(Continued)

(58) Field of Classification Search
CPC . H01L 29/7848; H01L 29/04; H01L 29/0847; H01L 29/36; H01L 29/66628; H01L 29/78; H01L 29/78618; H01L 29/78654; H01L 27/1203; H01L 21/02532
See application file for complete search history.

(56) References Cited

U.S. PATENT DOCUMENTS

| | | | |
|---|---|---|---|
| 5,953,605 A | 9/1999 | Kodama | |
| 2006/0138398 A1* | 6/2006 | Shimamune | ...... H01L 21/02381 257/19 |

(Continued)

OTHER PUBLICATIONS

French Preliminary Search Report dated Nov. 8, 2017 in French Application 17 52035 filed on Mar. 13, 2017(with English Translation of Categories of Cited Documents).
(Continued)

*Primary Examiner* — Yosef Gebreyesus
(74) *Attorney, Agent, or Firm* — Oblon, McClelland, Maier & Neustadt, L.L.P.

(57) ABSTRACT

Field-effect transistor, the source and drain regions whereof are formed from a crystalline structure comprising:
a first layer comprising two main faces parallel to one another and two lateral faces parallel to one another, the main faces being perpendicular to the lateral faces,
a second layer overlapping the first layer, the second layer comprising a first main face and a second main face parallel to one another and two lateral faces, the first main face being in contact with the first layer, the lateral faces forming an angle α in the range 50° to 59°, and preferably a 53° angle, with the first main face.

8 Claims, 2 Drawing Sheets

(52) U.S. Cl.
CPC ........ *H01L 29/78* (2013.01); *H01L 29/78618* (2013.01); *H01L 29/78654* (2013.01)

(56) References Cited

U.S. PATENT DOCUMENTS

| | | | | |
|---|---|---|---|---|
| 2012/0108019 | A1* | 5/2012 | Hartmann | ......... H01L 21/76283 |
| | | | | 438/197 |
| 2014/0145271 | A1* | 5/2014 | Cheng | ................... H01L 27/088 |
| | | | | 257/368 |
| 2016/0247888 | A1 | 8/2016 | Kerber et al. | |

OTHER PUBLICATIONS

L. Grenouillet et al. "UTBB FDSOI scaling enablers for the 10 nm node", IEEE SOI-3Dsubthreshold microelectronics technology unified conference , 2013, pp. 3.

J.M Hartmann et al. "A benchmarking of silane, disilane and dichlorosilane for the low temperature growth of group IV layers", Thin Solid Films 520, 2012, pp. 5.

Tohru Aoyama et al. "Facet formation mechanism of silicon selective epitaxial layer by Si ultrahigh vacuum chemical vapor deposition", Journal of Crystal Growth 136, 1994, pp. 6.

U.S. Appl. No. 15/261,226, filed Sep. 9, 2016, 2017/0076997 A1, Shay Reboh et al.

U.S. Appl. No. 15/335,123, filed Oct. 26, 2016, 2017/0125458 A1, Olivier Rozeau et al.

U.S. Appl. No. 15/523,742, filed May 2, 2017, 2017/0358459 A1, Shay Reboh et al.

U.S. Appl. No. 15/711,549, filed Sep. 21, 2017, Shay Reboh et al.

* cited by examiner

TRANSISTOR HAVING STRUCTURED SOURCE AND DRAIN REGIONS AND PRODUCTION METHOD THEREOF

TECHNICAL FIELD AND PRIOR ART

This invention relates to a field-effect transistor having structured, raised source and drain regions. This invention further relates to a method for producing a faceted crystalline structure, in particular, to form the raised source and drain regions of a transistor.

FIG. 1a is a diagrammatic, cross-sectional view of a conventional MOS (Metal Oxide Semiconductor)-type field-effect transistor.

The transistor comprises a substrate 100, for example made of silicon-on-insulator (SOI). The transistor comprises an electrically conducting gate 101 insulated from the surface of the substrate 100 by a gate insulator 102. Spacers 103 surround the gate 101 and rest on the substrate 100. Raised source and drain regions (RSD) 104a, 104b extend from the substrate 100 on either side of the gate 101. The raised source and drain regions 104a, 104b are made of a crystalline semi-conducting material, and are n-doped if the transistor is an n-channel transistor. So-called extension zones 105a, 105b of the source/drain regions extend under the gate of the transistor. These zones are n-type diffused zones (less doped than the source/drain regions).

The transistor in FIG. 1a further comprises two layers 106a, 106b overlapping the source/drain regions 104a, 104b. These zones 106a, 106b are made of metal silicide and form the metallisations of the source and drain of the transistor. These metallisations must not be in contact with the channel 107 to prevent the silicidation of the channel.

The electrical properties of the MOS transistors are limited by various capacitances: the contact capacitance between the gate 101 and the contacts deposited on the metallisations of the source/drain regions 104a, 104b, the capacitance between the gate 101 and the source/drain regions 104a, 104b via the spacers 103 (called the outer fringe capacitance), and the direct overlap capacitance between the gate 101 and the extensions 105a, 105b of the source/drain regions 104a, 104b.

In order to reduce the capacitance between the gate 101 and the raised source/drain regions 104a, 104b a first solution consists of reducing the thickness of the source/drain regions 104a, 104b. However, a reduction in the thickness of the source/drain regions 104a, 104b leads to a reduction in the number of dopants capable of being diffused in the channel 107 and under the spacers 103. A too low thickness could also result in high silicidation of the source/drain regions.

As shown in FIG. 1b, another solution for reducing this stray capacitance consists in producing faceted source/drain regions 104a, 104b to distance the source/drain regions from the spacers 103 (Grenouillet et al. UTBB FDSOI scaling enablers for the 10 nm node, IEEE SOI-3D-subthreshold microelectronics technology unified conference (S3S), 2013). However, when the source/drain regions 104a, 104b are distanced from the spacers 103, there is a risk of silicidation of the channel 107 during the formation of the metallisation 106a, 106b. Moreover, after etching, the spacer may have, at the base thereof, several fluctuations in thickness, resulting in variations in electrical performance (through the diffusion of the dopants), in particular in the case of faceted source/drain regions, and therefore in significant random fluctuations in the performance of the transistors.

DESCRIPTION OF THE INVENTION

As a result, one purpose of this invention is to provide a transistor with stray capacitances that are lower than those of the transistors of the prior art and having high performance levels.

For this purpose, this invention proposes a field-effect transistor, such as an FDSOI transistor, comprising:
- a channel region made of a first crystalline semi-conducting material, overlaid by a gate structure, the gate structure comprising a gate and insulating spacers lining the sidewalls of the gate,
- a raised source region and a raised drain region, made of a second crystalline semi-conducting material, situated on either side of the insulating spacers, the raised source and drain regions being formed from a faceted crystalline structure comprising:
- a first layer in contact with the first crystalline semi-conducting material of the channel region, the first layer comprising two main faces parallel to one another and two lateral faces parallel to one another, the main faces being perpendicular to the lateral faces, one of the lateral faces being in contact with one of the spacers,
- a second layer overlapping the first layer, the second layer comprising a first main face and a second main face parallel to one another and two lateral faces, the first main face being in contact with an upper main face of the first layer, the lateral faces forming a 50° to 59° angle, and preferably a 53° angle, with the first main face.

The term crystalline shall be understood herein as monocrystalline. The term parallel shall be understood herein as parallel or substantially parallel. Similarly, the term perpendicular shall be understood herein as perpendicular or substantially perpendicular. For example, one of the main faces of the first layer can form an 88° to 92° angle with one of the lateral faces of the first layer. A 53° angle shall be understood herein as an angle of 53°±0.5°, whereby the variation depends on the crystalline quality of the substrate. The 53° angle α is typical of a crystalline growth {111}.

Such faceted source and drain regions not only allow the stray capacitances to be reduced, but also protect the channel of the transistor from the metallisations of the source and drain regions.

Advantageously, the upper main face of the first layer is entirely overlapped by and in contact with the first main face of the second layer.

This configuration reduces the channel-access resistance, in particular compared to a device in which the upper main face of the first layer is partially overlapped by an insulating spacer.

By maximising the contact area between the upper face of the first layer and the first main face of the second layer, a higher strain can also be induced on the channel region, in particular when the source and drain regions have a base made of a second crystalline semi-conducting material with a mesh parameter that is different to that of the first crystalline semi-conducting material.

Such a configuration provides the second layer with an outer surface area (cumulated surface area of the second main face and lateral faces thereof not in contact with the first layer) to form an improved contact on the second layer.

Advantageously, the first layer has a thickness that lies in the range 2 nm to 5 nm, and preferably in the range 2 nm to 3 nm. Such thicknesses provide a structure with facets that begin low, near the channel, and thus effectively limit the stray capacitances.

Advantageously, the second layer has a thickness that lies in the range 5 nm to 50 nm, and preferably in the range 5 nm to 20 nm.

Advantageously, the second main face of the second layer has a length that is greater than 10 nm and less than 1,000 nm, and preferably from 20 nm to 50 nm. This length allows for a good contact to be made on the source and drain regions, while being low enough to limit access resistance.

Advantageously, the first crystalline semi-conducting material is Si or SiGe and the second crystalline semi-conducting material is SiGe.

Advantageously, the first layer is doped with a dopant and has a dopant concentration of greater than or equal to $7.10^{19}$ at/cm$^3$.

Advantageously, the second layer is doped with a dopant and has a dopant concentration of greater than or equal to $2.10^{20}$ at/cm$^3$. This allows for good contact on the upper portion of the source/drain region.

The dopant concentration of the first layer can be identical or different to the dopant concentration of the second layer.

Advantageously, the faceted crystalline structure forming the source region and/or the drain region is free from any defects. The transistor has higher performance levels.

Advantageously, the faceted crystalline structure is overlapped by a layer of silicide, whereby the channel is insulated from the silicide layer by the faceted crystalline structure.

There is also a need to produce structured source and drain regions. The invention further relates to a method for producing a faceted crystalline structure that is easy to implement. This purpose is achieved by a method comprising the successive steps of:

a) providing a substrate comprising a thin surface layer made of a first crystalline semi-conducting material, b) producing the faceted structure made of a second crystalline semi-conducting material on the substrate according to the steps of:

b1) producing a first non-faceted layer, on the thin surface layer, by epitaxy in the presence of a mixture of reagents such that it enables the crystalline growth of the second semi-conducting material along the crystalline plane 100, b2) producing a second faceted layer, on an upper main face of the first layer, by epitaxy in the presence of a mixture of reagents such that it enables the crystalline growth of the second semi-conducting material along the crystalline plane 111.

Advantageously, the upper main face of the first layer is entirely overlapped by, and in contact with, the second layer.

This reduces the channel-access resistances, potentially increases the strain induced on the channel region, and gives the second layer a larger outer surface area for the production of the contacts thereon.

The method can be used to produce complex crystalline structures using epitaxy steps only.

Advantageously, the mixture of reagents of the first epitaxy comprises at least one chlorinated precursor of the second semi-conducting material.

Advantageously, the mixture of reagents of the second epitaxy comprises at least one hydrogenated precursor of the second semi-conducting material.

Advantageously, the first crystalline semi-conducting material is Si or SiGe and the second crystalline semi-conducting material is SiGe.

Advantageously, the mixture of reagents of the first epitaxy comprises dichlorosilane, germane, hydrochloric acid and possibly diborane.

Advantageously, the mixture of reagents of the second epitaxy comprises silane, germane, hydrochloric acid and possibly diborane.

Advantageously, the mixture of reagents of the second epitaxy further comprises an additional compound chosen from the group comprised of dichlorosilane or a compound having the formula $Si_nH_{2n+2}$ where n>1, the additional compound representing 15 vol. % at most relative to the total volume formed by the silane and the additional compound.

Advantageously, the epitaxies take place at a temperature of less than 700° C., and more advantageously at a temperature in the range 575° C. to 675° C.

The method is advantageously used to form the source and drain regions of a field-effect transistor, such as an FDSOI transistor, and more particularly a pMOS transistor.

Advantageously, the first layer and the second layer are produced by successive epitaxies without any intermediate deposition or etching step.

Advantageously, the first layer and the second layer are produced by successive epitaxies in the same reactor (or in the same equipment) and without removing the substrate from said reactor (or respectively from said equipment).

BRIEF DESCRIPTION OF THE FIGURES

Other features and advantages of the invention will be better understood upon reading the following description and the accompanying figures, in which.

The different parts shown in the figures are not necessarily displayed according to a uniform scale in order to make the figures easier to read.

The different possibilities (alternatives and embodiments) must be understood as not being exclusive with regard to each other and can be combined together.

DETAILED DESCRIPTION OF THE SPECIFIC EMBODIMENTS

Figure 1A:
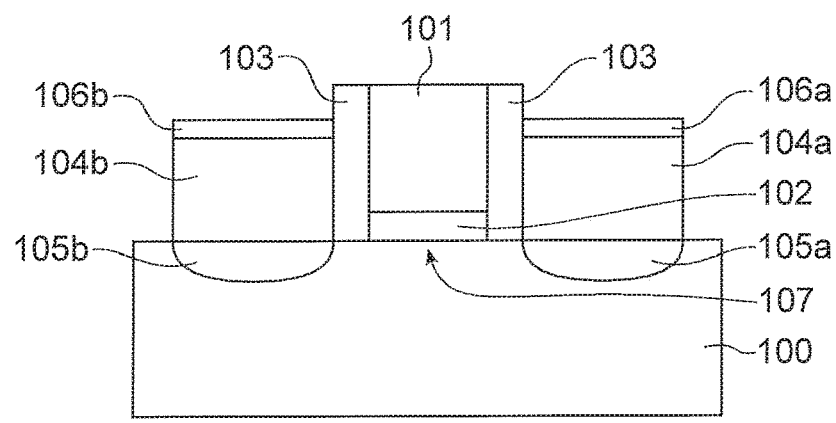
FIG. 1a, already described hereinabove, is a partial, sectional, profile view of a transistor according to the prior art.
Figure 1B:
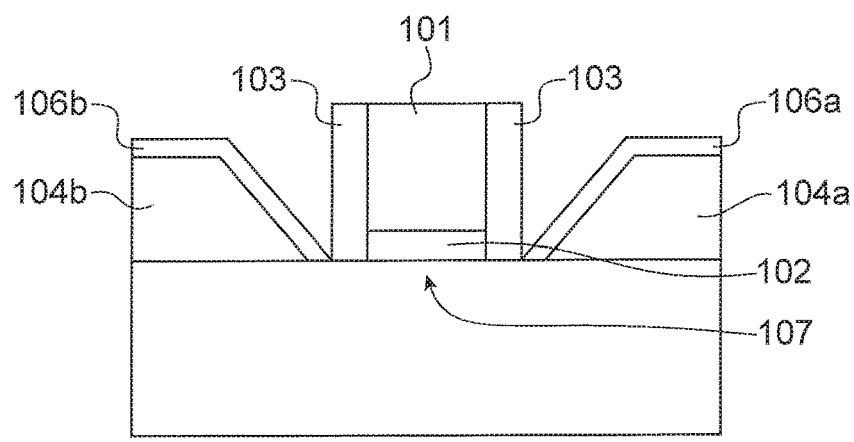
FIG. 1b is a partial, sectional, profile view of a transistor, the metallisations of the source and drain regions whereof are in contact with the channel.
Figure 2:
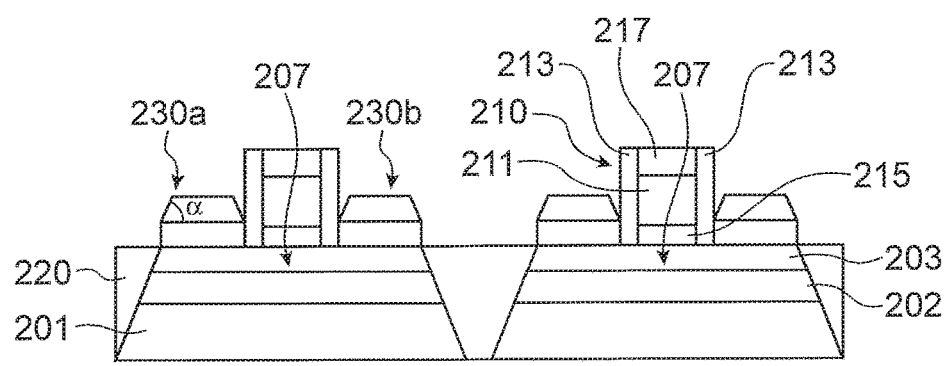
FIG. 2 is a partial, sectional, profile view of a transistor according to a first embodiment of the invention.

Field-effect Transistor:

These paragraphs are provided with reference to FIG. 2, which shows a partial, sectional, profile view of a field-effect transistor.

The transistor is produced on a substrate 200 made of a crystalline semi-conducting material.

Figure 3:
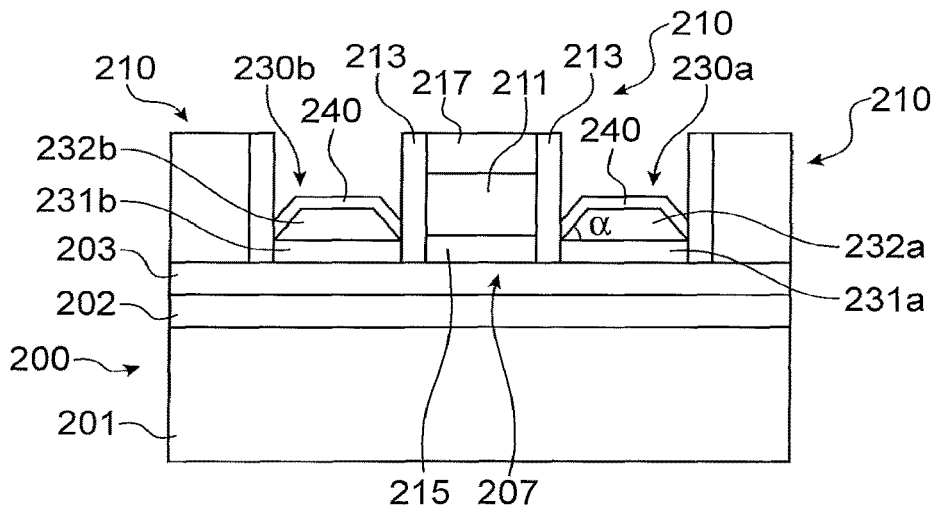
FIG. 3 is a partial, sectional, profile view of a transistor according to a second embodiment of the invention.
Figure 4:
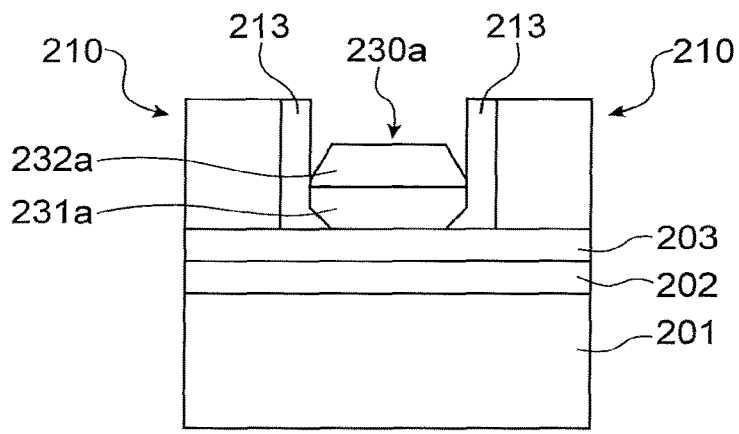
FIG. 4 is a partial, sectional, profile view of a transistor according to a third embodiment of the invention.

According to one preferred embodiment, shown in FIGS. 2 to 4, the transistor is an FDSOI (Fully Depleted Silicon On Insulator) transistor. The SOI substrate 200 comprises a base carrier made of a semi-conducting material 201, an insulating layer 202 and a thin layer made of a crystalline semi-conducting material 203, called a surface layer. The insulating layer 202 is positioned between the carrier layer 201 and the surface layer 203. The insulating layer 201 in particular prevents parasitic currents from flowing to the solid part of the substrate and produces better insulation of the source and drain regions. The insulating layer 202 can in particular be a BOX (Buried Oxide)-type layer or TBOX (Thin Buried Oxide)-type layer having a thickness in the range 10 nm to 200 nm, for example of about 20 nm. The thin semi-conducting surface layer 203 has a thickness that lies in the range, for example, 2 nm to 200 nm, for example of about 6 nm.

The thin surface layer 203 is preferably made of crystalline silicon or crystalline SiGe. The SiGe material advantageously has a concentration of 10 at. % to 40 at. % germanium, and in an even more advantageous manner, from 15 at. % to 35 at. %, for example of about 25 at. %. Alternatively, the thin surface layer 203 of the substrate 200 could, for example be made of a III-V material.

The channel region 207 of the transistor is formed in the thin surface layer 203 of the substrate 200. The channel region 207 is overlaid by a gate structure 210, the gate structure 210 comprising a gate 211 and electrically insulating spacers 213 lining the sidewalls thereof.

The gate 211 of the transistor can be formed from a stack comprising a metal layer, for example having a TiN base, on which rests a semi-conducting layer, for example having a polysilicon base.

The gate 211 is separated from the substrate 200 by an electrically insulating material, called a gate insulator 215. The electrically insulating material is, for example, formed from an oxide layer, also called a gate oxide, and a dielectric material layer, which can be a gate metal chosen depending on the chosen threshold voltage. The oxide layer is in contact with the substrate. This is, for example, $HfO_2$ or HfSiON.

Insulating spacers 213, also called lateral insulating regions, are formed against the lateral sidewalls of the gate 211, and rest on the semi-conducting substrate 200. The spacers 213 are formed from one or more electrically insulating materials, for example having a $Si_xN_y$, SiBCN, SiCO or SiOCN base. The spacers 213 advantageously have a thickness that lies in the range 4 nm to 12 nm, even more advantageously in the range 6 nm to 8 nm. The spacers 213 also serve the purpose of distancing the source/drain regions from the gate 211 and from the channel region 207.

The gate 211 can also be overlapped by a hard mask 217 made of an electrically insulating material, an oxide or a nitride for example, in particular when the last layer is made of polycrystalline silicon, so as not to consume the gate during the different etching steps.

The gate structure 211 is manufactured according to microelectronic methods well known to a person skilled in the art and shall not be described herein.

As shown in FIG. 2, the transistors of the same layer can be isolated from one another by lateral isolating trenches 220 (known as STI or "Shallow Trench Isolation").

Raised Source/Drain Regions of the Transistor:

A source region 230a and a drain region 230b, made of a crystalline semi-conducting material, are situated on either side of the insulating spacers 213, and in direct contact with the semi-conducting material of the thin surface layer 203.

The location of the source 230a and drain 230b regions could be inverted.

The source 230a and drain 230b regions are made of an IV-IV material. They could also be, for example, made of a III-V material. Preferably, the source 230a and drain 230b regions are made of SiGe. Raised sources and drains 230a, 230b can be produced using materials different from those of the channel, in order to increase the strain in the channel. SiGe can be used for a pMOS transistor to induce a compressive strain on the channel zone, for example, made of silicon.

As shown in FIG. 3, a raised source/drain region 230a, 230b can be positioned between two gate structures 210.

As shown in FIGS. 2 to 5, the source region 230a and the drain region 230b are each formed from a faceted crystalline structure formed from a dual-layer stack. The stack comprises and is preferably constituted from:

a first layer 231a, 231b in contact with the substrate 200, and more particularly with the thin surface layer 203, the first layer 231a, 231b comprising two main faces parallel to one another and two lateral faces parallel to one another, the main faces being perpendicular to the lateral faces, one of the lateral faces being in contact with one of the spacers 213, a second layer 232a, 232b overlapping the first layer 231a, 231b, the second layer 232a, 232b comprising two main faces parallel to one another and two lateral faces, one of the main faces being in contact with the first layer 231a, 231b, the lateral faces forming a 50° to 59° angle α, and preferably a 53° angle, with the main face in contact with the first layer 231a, 231b.

Such a structure minimises the capacitance between the gate and the source/drain regions, as a result of the presence of facets on the upper layer of the stack.

This structure further prevents problems concerning the silicidation of the channel during the metallisation of the source/drain regions 230a, 230b. Given that the first layer 231a, 231b is in contact with the sidewall of the spacers 213, no silicidation of the channel will occur; in other words, the channel will not be contaminated by the silicide 240 (FIG. 3).

According to an advantageous configuration shown of the source and drain regions 230a, 230b, the first layer 231a, 231b comprises an upper face that is in contact with the second layer 232a, 232b and fully overlapped by the second layer 232a, 232b. This configuration, wherein the semi-conducting material of the first layer 231a, 231b is only overlapped by the semi-conducting material of the second layer 232a, 232b and is in particular not overlapped by an insulating material, procures reduced channel-access resistances, in particular when compared to a structure with dual insulating spacers and wherein a second pair of spacers formed against a first pair of spacers is partially at rest against the first layer 231a, 231b.

Figure 5:
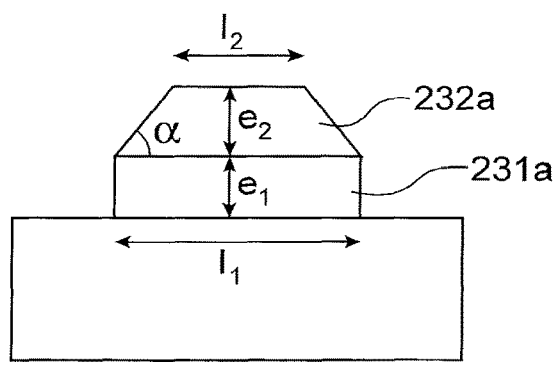
FIG. 5 is a partial, sectional, profile view of a faceted crystalline structure on a substrate according to one specific embodiment of the invention.

FIG. 5 shows a structured source region 230a. This could have been the drain region 230b which has the same architecture. The first layer 231a thickness $e_1$ that lies in the range 2 nm to 5 nm, preferably in the range 2 nm to 3 nm. The thickness $e_1$ of the first layer 231a determines the height at which the facet of the crystalline structure 230a begins.

The second layer 232a has a thickness $e_2$ that lies in the range 5 nm to 50 nm, preferably in the range 5 nm to 20 nm.

The length $l_2$ of the second face of the second layer 232a depends on the thickness $e_2$ chosen, as the angle α between the lateral walls and the first face is fixed. This length $l_2$ must suffice to allow contact to be made on the source/drain regions 230a. Simultaneously, it must not be high enough to limit the access resistance, which is inversely proportional to the silicide surface area 240 deposited on the source/drain regions 230a. The silicide surface area deposited further depends on the surface area of the source/drain regions which is accessible during silicidation. Advantageously, a length $l_2$ greater than 10 nm will be chosen. Advantageously, it will be less than 1,000 nm, and preferably about 20 nm to 50 nm.

The thickness $e_2$ of the second layer 232a will be chosen so as to allow contact to be made on the second layer 232a while limiting the access resistance.

In the case of a SiGe crystalline structure, the concentration of germanium in the first layer 231a, 231b and/or in the second layer 232a, 232b can be constant, increasing or decreasing, in a direction perpendicular to the thickness $e_1$, $e_2$ of the layers.

Method for Producing Raised Source/Drain Regions:

Although the method makes explicit reference to a transistor, it can be implemented for the simultaneous manufacture of a plurality of transistors.

In general, it is implemented to produce any element made of a crystalline semi-conducting material, the structure of which must be faceted, and the growth of which can take place from a suitable substrate.

This method has been seen to operate particularly well when producing faceted crystalline structures made of SiGe.

In order to produce the raised source and drain regions of the transistor, and provide a faceted structure thereto, the crystalline semi-conducting material is grown from the substrate by means of two successive epitaxies. The first epitaxy takes place in the presence of a mixture of reagents such that it enables the crystalline growth of the semi-conducting material along the crystalline plane 100. The second epitaxy takes place in the presence of a mixture of reagents such that it enables the crystalline growth of the semi-conducting material along the crystalline plane 111.

Preferably, the mixture of reagents of the first epitaxy comprises at least one chlorinated precursor of the semi-conducting material to be grown and the mixture of reagents of the second epitaxy comprises at least one hydrogenated precursor of the semi-conducting material to be grown.

Epitaxy in a Chlorinated Medium:

During chlorinated chemical epitaxy, the crystalline deposition grows on the zones of the transistor made of a crystalline semi-conducting material. No deposition occurs on the other zones such as the insulating zones made of a dielectric material (oxide or nitride) or on the zones made of a non-crystalline semi-conducting material. The use of chlorinated chemical epitaxy results in selective growth. In the case of SiGe, the poly-SiGe nuclei that form on the zones overlapped by a dielectric material will be etched progressively with the formation thereof, ultimately resulting in an increase in the thickness of the region made of a semi-crystalline material solely in the direction (100).

In the case of the formation of source/drain regions made of SiGe, the selective chlorinated chemical epitaxy takes place with a mixture of reagents comprising dichlorosilane $SiH_2Cl_2$ (DCS), germane $GeH_4$ and hydrochloric acid HCl, and possibly with diborane $B_2H_6$ to dope the SiGe in situ. Alternatively, dichlorogermane could be used.

According to another alternative embodiment, silane could be present in the mixture, whereby the weight ratio of silane/dichlorosilane does not exceed 10%.

Preferably, the mixture of reagents is constituted from dichlorosilane $SiH_2Cl_2$, germane $GeH_4$, hydrochloric acid HCl and diborane $B_2H_6$.

The gas used to transport the reagents is, preferably, dihydrogen. Alternatively, nitrogen could be used.

The chlorinated chemical epitaxy advantageously takes place at a temperature in the range 500° C. to 700° C., preferably at a temperature in the range 500° C. to 650° C.

Advantageously, as shown in FIG. 4, even though the spacer 213 has a discontinuity, also called a base, the first epitaxied layer 231a of the crystalline structure 230 will overlap it.

Epitaxy in a Hydrogenated Medium:

The use of silane may result in a less selective epitaxy. This is also known as non-selective epitaxy combined with selective etching. Such an epitaxy consists of depositing, in a non-selective manner over the entire surface area of the substrate, monocrystalline or polycrystalline layers. In the case of SiGe, the fact that hydrochloric acid etches poly-SiGe much faster than monocrystalline SiGe is used in order to remove the polycrystalline material on the dielectric zones. This type of method may take place in cycles.

Selective deposition may also occur when the precursors, for example SiGe, are introduced at the same time as the hydrochloric acid (called "co-flow" epitaxy).

Hydrogenated epitaxy results in a more limited lateral growth than chlorinated epitaxy, and thus in the formation of facets in the direction (111).

Preferably, selective hydrogenated chemical epitaxy takes place with a mixture of reagents including:
a first silicon precursor: silane $SiH_4$,
germane $GeH_4$,
and hydrochloric acid HCl,
and possibly diborane $B_2H_6$ to dope the SiGe in situ.

Advantageously, the fact that hydrochloric acid etches poly-SiGe much faster than monocrystalline SiGe is used in order to remove the layers present on the dielectric zones.

According to one specific embodiment, the mixture comprises another silicon precursor, such as dichlorosilane or a compound having the formula $Si_nH_{2n+2}$ where n>1, such as $Si_2H_6$, $Si_3H_8$, or $Si_4H_{10}$. The other silicon precursor represents at most 15 vol. % relative to the total sum of the silicon precursors. The mixture of precursors mainly comprises the hydrogenated precursor. The addition of another silicon precursor having the formula $Si_nH_{2n+2}$ where n>1 may result in a change to the speed of growth of the crystal.

Preferably, the mixture of reagents is constituted from silane $SiH_4$, germane $GeH_4$, hydrochloric acid HCl and diborane $B_2H_6$.

The gas used to transport the reagents is, preferably, dihydrogen. Alternatively, nitrogen could be used.

The epitaxy in the presence of silane advantageously takes place at a temperature in the range 580° C. to 700° C.

The successive epitaxies preferably take place at a temperature of less than 700° C., and more particularly at a temperature in the range 575° C. to 675° C. Advantageously, with such temperatures, the dewetting phenomena that could be seen with a strained SiGe channel having a small thickness, are reduced.

With such a production method, the faceted epitaxial structure 230a, 230b is free from any defects. There is no disorientation in the crystalline material, even at the spacers, as there is no strain in the semi-conducting material during the crystalline growth.

Epitaxies in a chlorinated medium, then in a hydrogenated medium may take place successively, and in particular without any other intermediate deposition or etching step being performed.

Successive epitaxies in a chlorinated medium followed by a hydrogenated medium may advantageously take place in the same equipment or in the same reactor, without removing the substrate between the two steps.

In addition to saving time, when the method is performed on an industrial scale, this improves the contact, or prevents degradation of the contact surface, between the first and second layer forming the raised source and drain regions.

Preferably, between the successive epitaxies performed using different precursors, a step is implemented to drain the deposition chamber of the reactor or deposition equipment.

Doping of the Source/Drain Regions:

Preferably, the doping of the raised source/drain regions 230a, 230b takes place in-situ (in the presence of a precursor of the dopant during the epitaxy). According to an alternative embodiment, the deposition and doping steps may be separated and take place successively.

The first layer 231a, 231b has a dopant concentration from $7.10^{19}$ to $5.10^{21}$ at/cm$^3$ in order to allow for diffusion of the dopant under the spacers 213 during activation annealing, while preserving a sufficient level of active dopant. A sufficient level of active dopant is understood herein as a dopant concentration of greater than or equal to $7.10^{19}$ at/cm$^3$.

The concentration will be adjusted as a function of the thickness of the spacer, the activation annealing and the concentration of germanium.

Advantageously, the second layer 232a, 232b has a dopant concentration from $2.10^{20}$ to $5.10^{21}$ at/cm$^3$. Such concentrations allow for sufficient dopant diffusion in the first layer 231a, 231b, if the latter is lightly doped, for example when looking to limit the diffusion under the spacers. After activation/diffusion annealing, the second layer 232a, 232b will advantageously have a dopant concentration of greater than or equal to $2.10^{20}$ at/cm$^3$, so as to ensure good contact on the upper portion of the layer 232a, 232b, via the silicide 240.

The dopant concentration of the first layer 231a, 231b can be identical or different to the dopant concentration of the second layer 232a, 232b.

For example, the source and drain regions can be provided with a heavily doped second layer 232a, 232b (HDD or Heavily Doped source/Drain), with a dopant concentration from $5.10^{20}$ to $5.10^{21}$ at/cm$^3$, and a lightly doped first layer 231a, 231b (LDD or Lightly Doped source/Drain), with a dopant concentration from $7.10^{19}$ to $2.10^{20}$ at/cm$^3$ so as not to obtain a too abrupt junction at the entry to the channel.

According to another alternative embodiment, it may be advantageous to have a high concentration ($5.10^{20}$-$5.10^{21}$ at/cm$^3$) near to the junction in order to make it as abrupt as possible after the thermal budget of the diffusion/activation annealing, which sometimes takes place several steps after the epitaxy ("drive-in anneal").

The dopant concentration in the first layer 231a, 231b and/or in the second layer 232a, 232b can be constant, increasing or decreasing, in a direction perpendicular to the thickness $e_1$, $e_2$ of the layers.

After the doping step, performed in situ or a posteriori, the method comprises a subsequent step of diffusion/activation annealing. This step advantageously takes place at a temperature that lies in the range 900° C. to 1,150° C. for a duration in the range 1 s to 60 s.

Preferably, the semi-conducting material is SiGe and the dopant is boron.

Illustrative and Non-limiting Examples for Producing a Faceted Epitaxial Structure Made of Crystalline SiGe:

Firstly, the crystalline silicon substrate of the SOI-type may be subjected to a thermal budget in order to clean the surface of the substrate. The thermal budget temperature may lie in the range 600° C. to 900° C., and preferably in the range 650° C. to 750° C., in particular in the case where the oxide layer is very thin.

Chlorinated and hydrogenated epitaxies take place using the parameters provided in the table hereinbelow:

|  | Chlorinated Epitaxy | Hydrogenated Epitaxy |
|---|---|---|
| Pressure (Torr) | 10 to 50 | 10 to 50 |
| Temperature (° C.) | 600 to 700 | 600 to 700 |
| HCl (sccm) | 100 to 400 | 100 to 400 |
| H$_2$ (L) | 15 to 40 | 15 to 40 |
| SiH$_4$ (sccm) |  | 100 to 400 |
| DCS (sccm) | 100 to 400 |  |
| B$_2$H$_6$ (1% in H$_2$) | 40 to 140 | 40 to 140 |
| GeH$_4$ (10% in H$_2$) | 80 to 200 | 80 to 200 |

Where sccm corresponds to the unit cm$^3$/min (standard cubic centimetres per minute).

The faceted epitaxial structures obtained are free from any crystalline defects.

The invention claimed is:

1. A method for producing a raised source region and a raised drain region of a field-effect transistor, the raised source region and the raised drain region being formed from a faceted crystalline structure, the method comprising the successive steps of:
    a) providing a substrate comprising a thin surface layer made of a first crystalline semi-conducting material,
    b) producing the faceted crystalline structure made of a second crystalline semi-conducting material on the substrate according to the steps of:
    b1) producing a first non-faceted layer, on the thin surface layer, by first epitaxy in presence of a mixture of reagents to enable crystalline growth of the second crystalline semi-conducting material along crystalline plane 100,
    b2) producing a second faceted layer, on the first non-faceted layer, by second epitaxy in presence of a mixture of reagents to enable crystalline growth of the second crystalline semi-conducting material along crystalline plane 111,
    an upper main face of the first non-faceted layer being entirely overlapped by and in contact with a first main face of the second faceted layer, and
    the mixture of reagents of the first epitaxy comprises at least one chlorinated precursor of the second crystalline semi-conducting material and the mixture of reagents of the second epitaxy comprises at least one hydrogenated precursor of the second crystalline semi-conducting material.

2. The method according to claim 1, wherein the first crystalline semi-conducting material is Si or SiGe and wherein the second crystalline semi-conducting material is SiGe.

3. The method according to claim 2, wherein the mixture of reagents of the first epitaxy comprises dichlorosilane, germane, hydrochloric acid and diborane.

4. The method according to claim 2, wherein the mixture of reagents of the second epitaxy comprises silane, germane, hydrochloric acid and diborane.

5. The method according claim 4, the mixture of reagents of the second epitaxy further comprising an additional compound comprised of dichlorosilane or a compound having a formula Si$_n$H$_{2n+2}$ where n>1, the additional compound representing 15 vol. % at most relative to a total volume formed by the silane and the additional compound.

6. The method according to claim 1, wherein the first epitaxy and the and second epitaxy take place at a temperature of less than 700° C.

7. The method according to claim 1, wherein the method is used to form the raised source region and the raised drain region of a pMOS Fully Depleted Silicon on Insulator (FDSOI) transistor.

8. The method according to claim 1, wherein the first non-faceted layer and the second faceted layer are produced by successive epitaxies in a same reactor or in a same equipment, without removing the substrate from said reactor or said equipment.

* * * * *